(12) United States Patent
Leobandung

(10) Patent No.: US 11,183,419 B2
(45) Date of Patent: Nov. 23, 2021

(54) UNCONFINED BURIED INTERCONNECTS

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/821,074

(22) Filed: Mar. 17, 2020

(65) Prior Publication Data

US 2021/0296156 A1    Sep. 23, 2021

(51) Int. Cl.
| | |
|---|---|
| H01L 21/74 | (2006.01) |
| H01L 29/66 | (2006.01) |
| H01L 29/06 | (2006.01) |
| H01L 23/48 | (2006.01) |
| H01L 21/762 | (2006.01) |
| H01L 21/768 | (2006.01) |

(52) U.S. Cl.
CPC ...... *H01L 21/743* (2013.01); *H01L 21/76224* (2013.01); *H01L 21/76895* (2013.01); *H01L 23/481* (2013.01); *H01L 29/0653* (2013.01); *H01L 29/66545* (2013.01); *H01L 29/66795* (2013.01)

(58) Field of Classification Search
CPC ............... H01L 21/743; H01L 23/481; H01L 21/76895; H01L 29/0653; H01L 21/76224; H01L 29/66545; H01L 29/66795
USPC .......................................... 257/618
See application file for complete search history.

(56) References Cited

U.S. PATENT DOCUMENTS

| | | |
|---|---|---|
| 6,261,908 B1 | 7/2001 | Hause et al. |
| 6,627,484 B1 | 9/2003 | Ang |
| 6,780,737 B2 | 8/2004 | Chen |
| 7,009,271 B1 | 3/2006 | Thurgate et al. |
| 7,803,689 B2 | 9/2010 | Baek |
| 9,159,735 B2 | 10/2015 | Tsair et al. |

(Continued)

FOREIGN PATENT DOCUMENTS

CN    104124248 A    10/2014

OTHER PUBLICATIONS

Zhu, et al. "Assessing Benefits of a Buried Interconnect Layer in Digital Designs," IEEE Transactions on Computer-Aided Design of Integrated Circuits and Systems, 36(2): Published Feb. 1, 2017; 6 pages.

*Primary Examiner* — Mohammad M Hoque
(74) *Attorney, Agent, or Firm* — Cantor Colburn LLP; Robert Sullivan

(57) ABSTRACT

Embodiments of the present invention are directed to fabrication methods and resulting semiconductor structures having a bulb-shaped buried interconnect positioned below a shallow trench isolation region. In a non-limiting embodiment of the invention, a cavity is formed below a surface of a substrate. The cavity extends under a portion of a semiconductor fin. The cavity is filled with a sacrificial material and a shallow trench isolation region is formed on the sacrificial material in the cavity. A portion of the shallow trench isolation region is removed to expose a surface of the sacrificial material in the cavity. The sacrificial material is removed from the cavity and replaced with a buried interconnect.

16 Claims, 13 Drawing Sheets

(56) References Cited

U.S. PATENT DOCUMENTS

| | | |
|---|---|---|
| 9,953,857 B2 | 4/2018 | Leobandung et al. |
| 10,074,716 B2 | 9/2018 | Chan et al. |
| 2004/0121575 A1 | 6/2004 | Chen |
| 2010/0041208 A1 | 2/2010 | Baek |
| 2011/0127605 A1* | 6/2011 | Kim ................ H01L 21/823487 257/334 |
| 2015/0021679 A1 | 1/2015 | Tsair et al. |
| 2016/0027869 A1 | 1/2016 | Chan et al. |
| 2016/0148832 A1 | 5/2016 | Leobandung et al. |
| 2018/0330989 A1 | 11/2018 | Chang et al. |
| 2020/0135634 A1* | 4/2020 | Chiang ............. H01L 29/41766 |

* cited by examiner

UNCONFINED BURIED INTERCONNECTS

BACKGROUND

The present invention generally relates to fabrication methods and resulting structures for semiconductor devices, and more specifically, to fabrication methods and resulting semiconductor structures having an unconfined buried interconnect positioned below a shallow trench isolation region.

The fabrication of very large scale integrated (VLSI) or ultra large scale integrated (ULSI) circuits requires the manufacture of sophisticated interconnect structures including metallic wiring that connects individual devices in a semiconductor chip to one another. Typically, the wiring interconnect network includes two types of features that serve as electrical conductors, namely, line features that traverse a distance across the chip, and conductive via features that connect lines in different levels. The conducting metal lines and conductive vias are made of conductive material, such as aluminum or copper, and are electrically insulated by interlayer dielectrics (ILD).

SUMMARY

Embodiments of the invention are directed to a method for forming a buried interconnect structure. A non-limiting example of the method includes forming a cavity below a surface of a substrate. The cavity extends under a portion of a semiconductor fin. The cavity is filled with a sacrificial material and a shallow trench isolation region is formed on the sacrificial material in the cavity. A portion of the shallow trench isolation region is removed to expose a surface of the sacrificial material in the cavity. The sacrificial material is removed from the cavity and replaced with a buried interconnect.

Embodiments of the invention are directed to a method for forming a semiconductor structure. A non-limiting example of the method includes forming a gate over a channel region of a substrate. A cavity is formed below a surface of the substrate. The cavity extends under the channel region. The method includes filling the cavity with a sacrificial material and forming a shallow trench isolation region on the sacrificial material in the cavity. A portion of the shallow trench isolation region is removed to expose a surface of the sacrificial material in the cavity and the sacrificial material is replaced with a buried interconnect.

Embodiments of the invention are directed to an integrated circuit. A non-limiting example of the integrated circuit includes a semiconductor fin on a substrate. The integrated circuit further includes a shallow trench isolation region on the substrate and a buried interconnect in a cavity below the shallow trench isolation region. A contact extends through a portion of the shallow trench isolation region to a surface of the buried interconnect.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
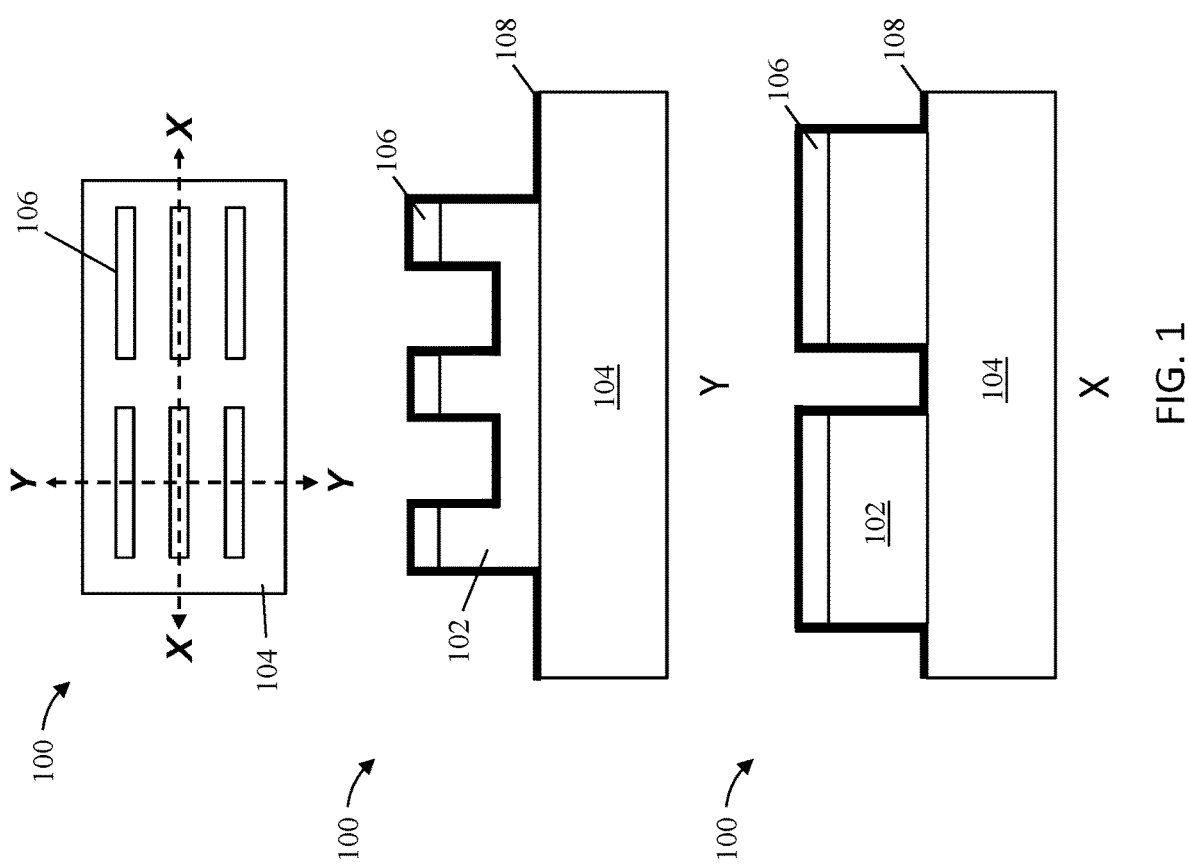
FIG. 1 depicts a top-down and cross-sectional view of a semiconductor structure after a processing operation according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

Interconnects close to the transistors need to be small because they attach/join to the components that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Connections between interconnect levels, called vias, allow signals and power to be transmitted from one layer to the next. For example, a through-silicon via (TSV) is a conductive contact that passes completely through a given semiconductor wafer or die. In multilevel IC configurations, for example, a TSV can be used to form vertical interconnections between a semiconductor device located on one level of the IC and an interconnect layer located on another level of the IC. These vertical interconnect structures include an appropriate metal and provide the electrical connection of the various stacked metallization layers.

The continued scaling of semiconductor devices has resulted in challenging fabrication requirements, especially when fabricating ever smaller metallization layers. To increase the number of circuits that can be provided on a chip, the semiconductor industry has repeatedly shrunk the transistor gate length and the chip size. As a consequence, the interconnect structure that forms the metallic circuitry has also shrunk. As integrated circuit (IC) feature sizes continue to decrease, the aspect ratio, (i.e., the ratio of height/depth to width) of features such as conductive vias can increase, while spacing tolerances (i.e., feature to feature spacing) decreases, complicating the manufacturing process.

Fabricating intricate structures of conductive interconnect layers within increasingly smaller wafer footprints is one of the most process-intensive and cost-sensitive portions of semiconductor IC fabrication. Advanced BEOL processes incorporate phase-shifting, optical proximity correction, and other practices to satisfy these scaling demands, and can achieve a line to line pitch below 30 nm. There are still challenges, however, in designing and fabricating advanced interconnects capable of meeting the ever-increasing demands of advanced process nodes. For example, decreases in device footprints available for interconnects and device contacts is placing real constraints on device density and on-chip power supplies.

Turning now to an overview of aspects of the present invention, one or more embodiments of the invention address the above-described challenges of the prior art by providing a new semiconductor structure and a method for fabricating interconnects having unconfined buried interconnects formed below the shallow trench isolation (STI) region. The unconfined buried interconnect (sometimes referred to as a bulb-shaped buried interconnect) can provide one additional local interconnect at the same device footprint, which is very useful for density and power requirements. While buried interconnects have been proposed before, those structures are confined within the STI, which can lead to parasitic resistance in the final device and lower device performance. In contrast to conventional buried interconnects, an "unconfined" buried interconnect refers to an interconnect positioned below the STI and having sufficient volume that the buried interconnect extends under the logic region of the substrate. In other words, the unconfined buried interconnect extends below a portion of the finFET, nanowires, stacked nanosheets, vertical FETs, etc., of the logic region of the substrate, depending on the transistor architecture of a given implementation. The enlarged region of the unconfined buried interconnect serves to mitigate the parasitic resistance associated with relatively smaller buried interconnects confined within the STI.

Turning now to a more detailed description of aspects of the present invention, FIG. 1 depicts a top-down view (top) and orthogonal cross-sectional views taken along the lines Y (middle) and X (bottom) of a semiconductor structure 100 after an initial set of fabrication operations according to one or more embodiments of the invention. As shown in FIG. 1, known fabrication operations have been used to form the semiconductor structure 100 such that it includes one or more fins 102 over a substrate 104.

While described with respect to the finFET transistor architecture for ease of illustration, it is understood that the process described herein can be applied to other transistor architectures, such as, for example, planar, nanosheet or gate-all-around transistor architectures. In some embodiments of the invention, the final semiconductor device can include a variety of types of MOSFETs, including, for example, non-planar n-type field effect transistors (NFET) and p-type field effect transistors (PFET). For example, the final semiconductor device can include n-type and/or p-type finFETs, nanosheets, vertical FETs, or any other type of transistor architecture.

In the embodiment of the invention shown in FIG. 1, the fins 102 are formed on the substrate 104 using known FEOL finFET fabrication techniques. The substrate 104 and the fins 102 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 and the fins 102 can be made of the same semiconductor material. In other embodiments of the invention, the substrate 104 can be made of a first semiconductor material, and the fins 102 can be made of a second, different semiconductor material. In some embodiments of the invention, the substrate 104 and the fins 102 can be made of silicon or SiGe. In some embodiments of the invention, the substrate 104 is silicon and the fins 102 are silicon germanium fins having a germanium concentration of about 10 to about 80 percent. The fins 102 can each have a height ranging from 4 nm to 150 nm. In some embodiments of the present invention, the fins 102 are formed to a height of about 60 nm, although other fin heights are within the contemplated scope of the invention.

In some embodiments of the invention, the substrate 104 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, a hard mask 106 is formed on the fins 102. In some embodiments of the invention, the fins 102 are formed by patterning the hard mask 106 and using a wet or dry etch process to selectively remove portions of the substrate 104 which are not covered by the hard mask 106. The hard mask 106 can be made of any suitable material, such as, for example, a silicon nitride. In some embodiments of the invention, a second hard mask (not depicted) is formed on the hard mask 106 to form a bilayer hard mask. In some embodiments, the second hard mask includes an oxide, such as, for example, silicon dioxide.

In some embodiments of the invention, a liner 108 is formed over the substrate 104 and the hard mask 106. In some embodiments of the invention, the liner 108 is conformally deposited using, for example, ALD, although other conformal deposition processes are within the contemplated scope of the invention. The liner 108 can be made of any suitable material, such as, for example, a low-k dielectric, a nitride, silicon nitride, SiON, SiC, SiOCN, or SiBCN. In some embodiments of the invention, the liner 108 includes a nitride (e.g., SiN). The liner 108 can be formed to a nominal (conformal) thickness of about 5 nm or less, or 3 nm or less, although other thicknesses are within the contemplated scope of the invention.

Figure 2:
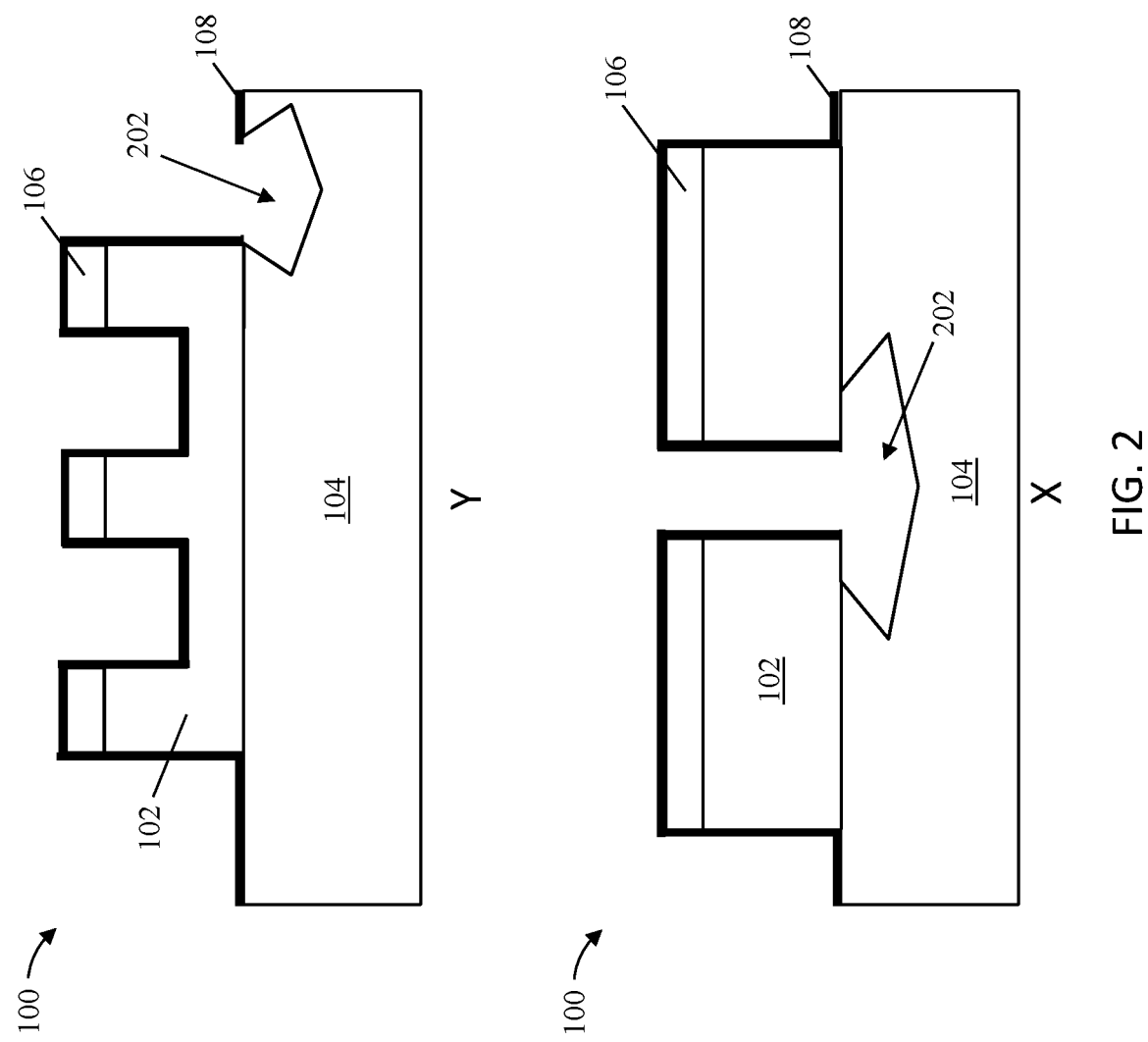
FIG. 2 depicts cross-sectional views of a semiconductor structure along the lines X and Y of FIG. 1 after one or more processing operations according to one or more embodiments of the invention.

FIG. 2 depicts cross-sectional views of the semiconductor structure 100 taken along the lines X and Y of FIG. 1 after a processing operation according to one or more embodiments of the invention. In some embodiments of the invention, portions of the liner 108 are removed to expose a surface of the substrate 104. The liner 108 can be removed using, for example, a wet etch, a dry etch, or a combination of sequential wet and/or dry etches.

In some embodiments of the invention, a cavity 202 (sometimes referred to as a bulb-shaped cavity due to the shape carved out by an isotropic etch into the substrate 104) is formed by recessing the exposed surface of the substrate 104 using an isotropic etch. As used herein, a "bulb-shaped" feature such as that depicted by cavity 202 in FIG. 2 refers generally to a shape having facets or sidewalls that are substantially equidistant from the origin of the isotropic etch. As shown in FIG. 2, in some embodiments of the invention, a portion of the cavity 202 extends under the fins 102. In some embodiments of the invention, the cavity 202 extends under the fins 102 by a distance of 50 to 250 nm as measured from the sidewall of the fin, although other extension distances are within the contemplated scope of the invention.

Figure 3:
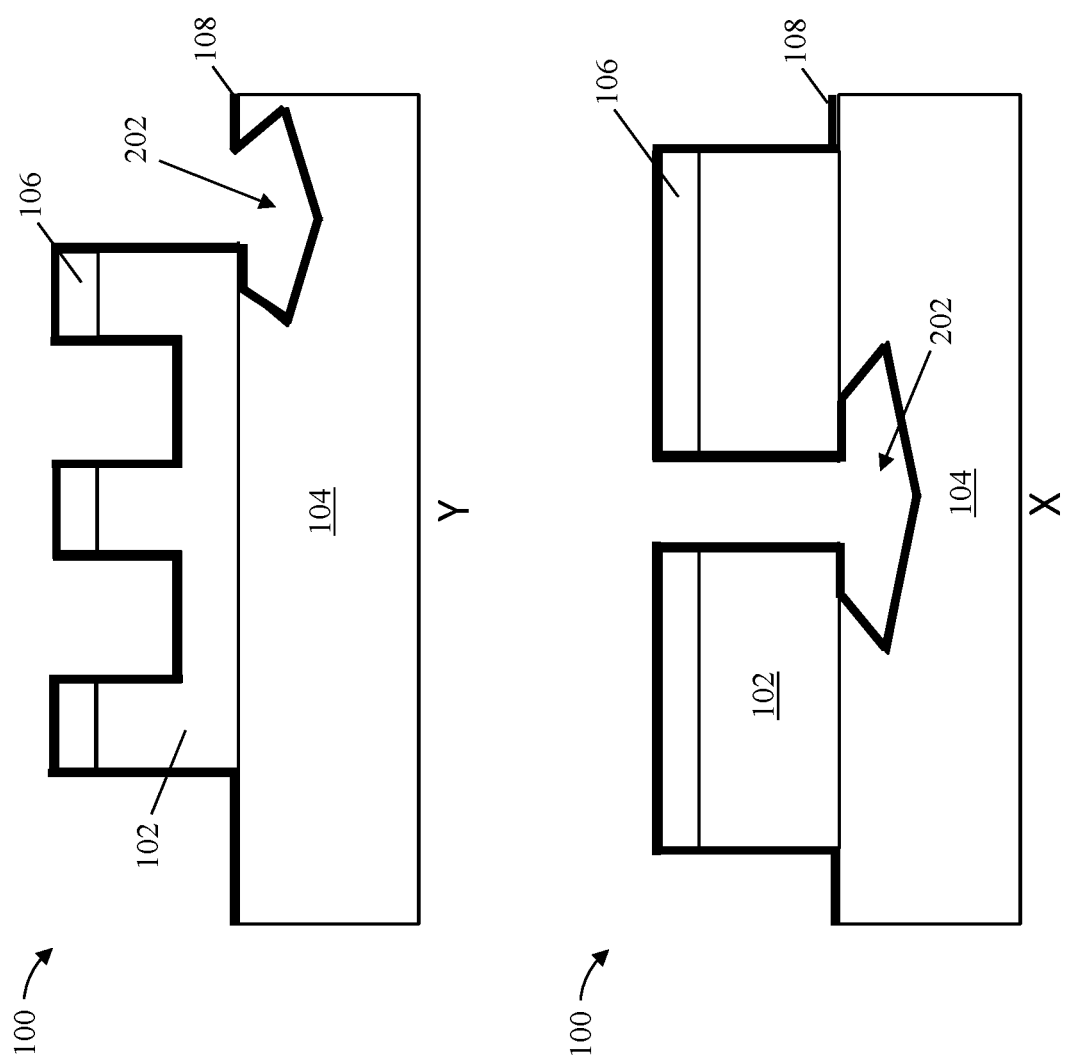
FIG. 3 depicts cross-sectional views of a semiconductor structure along the lines X and Y of FIG. 1 after one or more processing operations according to one or more embodiments of the invention.

FIG. 3 depicts cross-sectional views of the semiconductor structure 100 taken along the lines X and Y of FIG. 1 after a processing operation according to one or more embodiments of the invention. In some embodiments of the invention, additional liner material is deposited over the liner 108 and exposed portions of the substrate 104 in the cavity 202. The additional liner material can be made of the same material as the liner 108 and can together define a single liner. The additional liner material can be similarly formed to a nominal (conformal) thickness of about 5 nm or less, or 3 nm or less, although other thicknesses are within the contemplated scope of the invention. In this manner, portions of the liner 108 are positioned between the substrate 104 in the cavity 202 and the sacrificial region 402 (FIG. 4).

Figure 4:
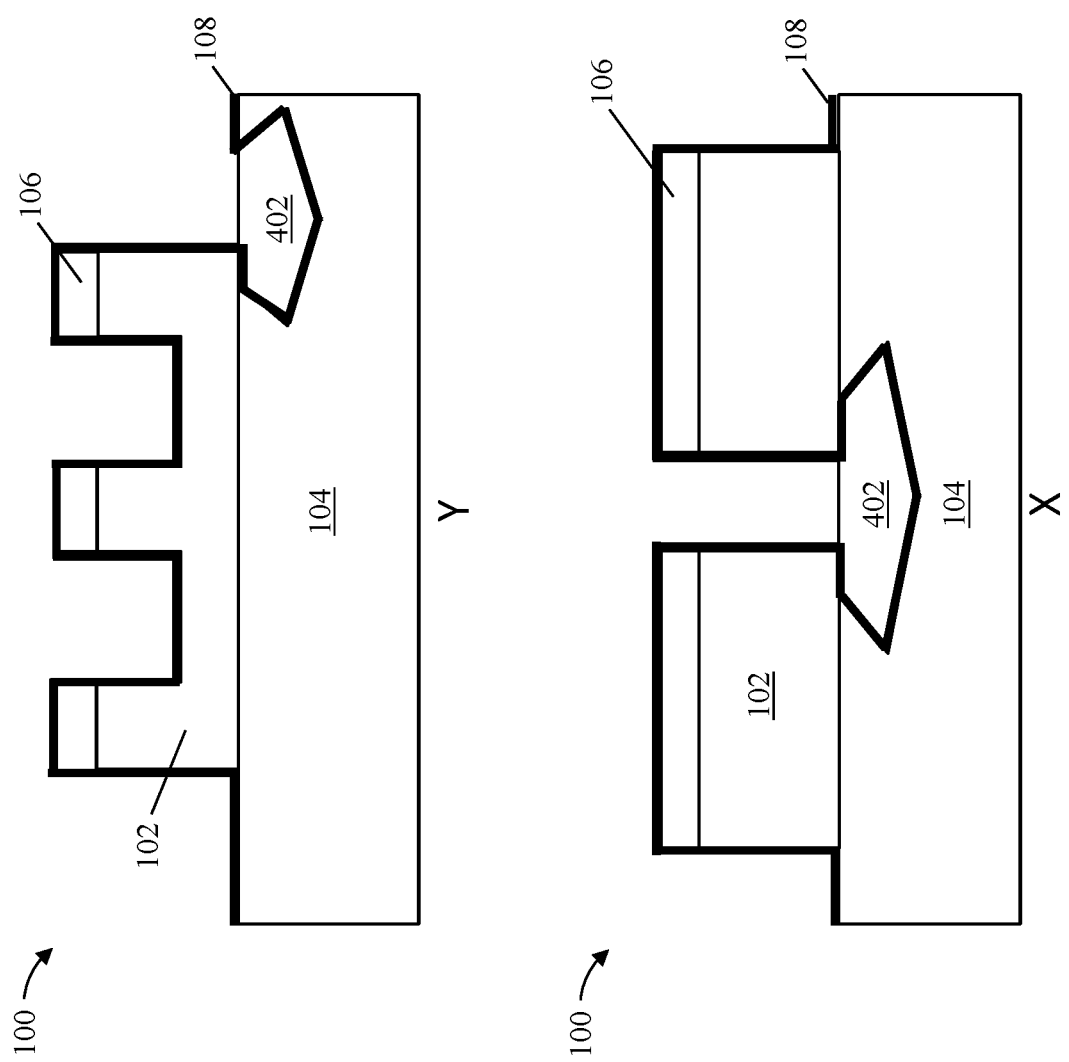
FIG. 4 depicts cross-sectional views of a semiconductor structure along the lines X and Y of FIG. 1 after one or more processing operations according to one or more embodiments of the invention.

FIG. 4 depicts cross-sectional views of the semiconductor structure 100 taken along the lines X and Y of FIG. 1 after a processing operation according to one or more embodiments of the invention. In some embodiments of the invention, a sacrificial region 402 (sometimes referred to as a dummy buried interconnect) is formed in the cavity 202. Any known manner of forming the sacrificial region 402 can be utilized, such as, for example, CVD, PECVD, ALD, flowable CVD, spin-on dielectrics, or PVD. In some embodiments of the invention, dielectric material is deposited over the semiconductor structure 100 and then recessed until the dielectric material is confined to the cavity 202.

The sacrificial region 402 can be made of any suitable sacrificial material. In some embodiments of the invention, the sacrificial region 402 is a dielectric material, such as, for example, a low-k dielectric (materials having a small dielectric constant relative to silicon dioxide, i.e., less than about 3.9), ultra-low-k dielectric (materials having a dielectric constant less than 3.0), porous silicate, carbon doped oxide, silicon dioxide, silicon nitride, silicon oxynitride, silicon carbide (SiC), or other dielectric material. In some embodiments of the invention, the sacrificial region 402 is a low-density dielectric material, such as, for example, spin-on glass.

Figure 5:
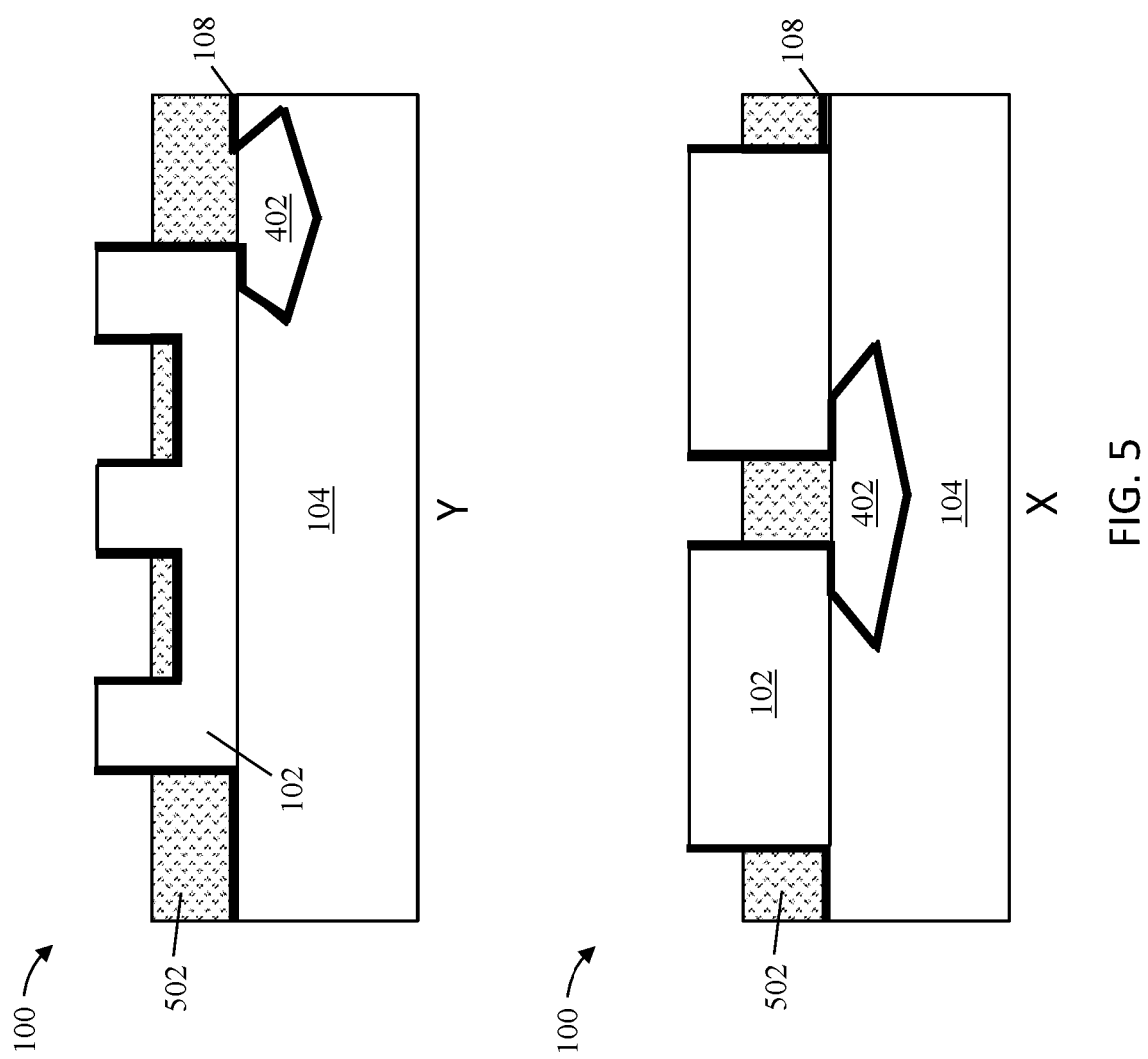
FIG. 5 depicts cross-sectional views of a semiconductor structure along the lines X and Y of FIG. 1 after one or more processing operations according to one or more embodiments of the invention.

FIG. 5 depicts cross-sectional views of the semiconductor structure 100 taken along the lines X and Y of FIG. 1 after a processing operation according to one or more embodiments of the invention. In some embodiments of the invention, a shallow trench isolation region 502 (also referred to as an STI region) can be formed over the substrate 104.

As shown in FIG. 5, the shallow trench isolation region 502 can be positioned between portions of the fins 102. In this manner, the fins 102 can be electrically isolated from each other as well as from other regions of the substrate 104. The shallow trench isolation region 502 can be made of any suitable dielectric material, such as, for example, a low-k dielectric, a nitride, silicon nitride, silicon oxide, SiON, SiC, SiOCN, or SiBCN. In some embodiments of the invention, the shallow trench isolation region 502 is recessed below the topmost surface of the fins 102. The shallow trench isolation region 502 can be recessed using, for example, a wet etch, a dry etch, or a combination of sequential wet and/or dry etches.

In some embodiments of the invention, the semiconductor structure 100 is planarized to a surface of the fins 102. In this manner, the hard mask 106 can be removed to expose a topmost surface of the fins 102. The semiconductor structure 100 can be planarized using any suitable process, such as chemical-mechanical planarization (CMP).

Figure 6:
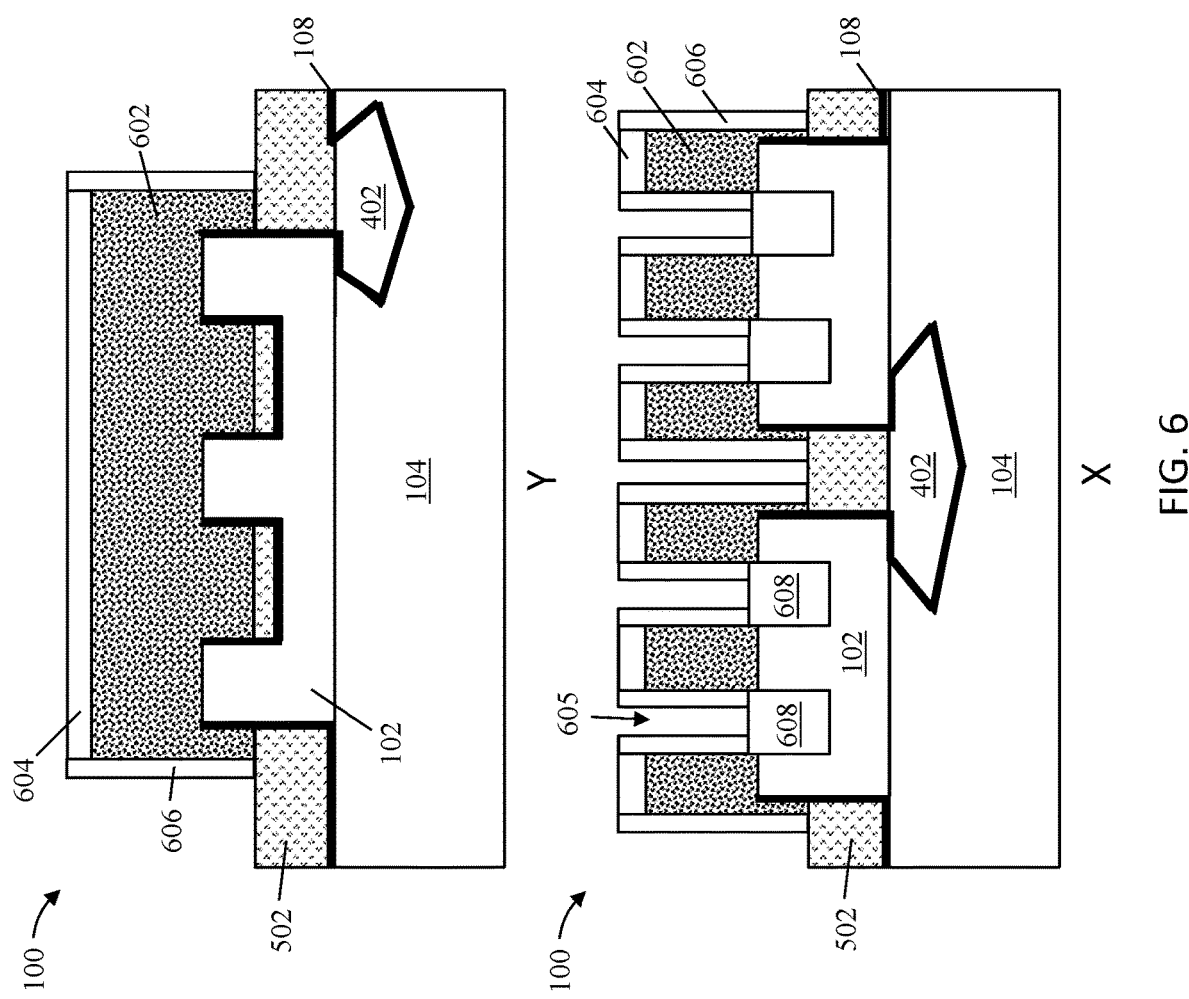
FIG. 6 depicts cross-sectional views of a semiconductor structure along the lines X and Y of FIG. 1 after one or more processing operations according to one or more embodiments of the invention.

FIG. 6 depicts cross-sectional views of the semiconductor structure 100 taken along the lines X and Y of FIG. 1 after a processing operation according to one or more embodiments of the invention. In some embodiments of the invention, one or more sacrificial gates 602 (sometimes referred to as dummy gates) are formed over the fins 102. The portion of a fin over which a gate is formed is referred to as a channel region. The sacrificial gates 602 can be made of any suitable material, such as, for example, amorphous silicon or polysilicon. Any known method for patterning a sacrificial gate can be used, such as, for example, a wet etch, a dry etch, or a combination of sequential wet and/or dry etches.

In some embodiments of the invention, a hard mask 604 (sometimes referred to as a gate hard mask) is formed on the sacrificial gates 602. In some embodiments of the invention, the sacrificial gates 602 are formed by patterning the hard mask 604 and using a wet or dry etch process to selectively remove portions of the sacrificial gates 602 which are not covered by the pattered hard mask 604 to define one or more trenches 605. In some embodiments of the invention, a thin oxide layer (not shown) is formed between the fins 102 and the sacrificial 602.

The hard mask 604 can be made of any suitable material, such as, for example, a silicon nitride. In some embodiments of the invention, a second hard mask (not depicted) is formed on the hard mask 604 to form a bilayer hard mask. In some embodiments, the second hard mask includes an oxide, such as, for example, silicon dioxide.

As shown in FIG. 6, in some embodiments of the invention, spacers 606 (also known as sidewall spacers or gate spacers) are formed on sidewalls of the sacrificial gates 602. In some embodiments of the invention, the spacers 606 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and then selectively removed using a RIE to form the spacers 606.

The spacers 606 can be made of any suitable material, such as, for example, a low-k dielectric, a nitride, silicon nitride, silicon oxide, SiON, SiC, SiOCN, or SiBCN. In some embodiments of the invention, the spacers 606 include silicon nitride. The spacers 606 can be formed to a thickness of about 5 to 40 nm, although other thicknesses are within the contemplated scope of the invention.

As further shown in FIG. 6, in some embodiments of the invention, source and drain regions 608 are formed between opposite sidewalls of the fins 102. In some embodiments of the invention, the source and drain regions 608 are formed to a thickness (height) of 10 nm or more above a topmost surface of the fins 102, for example 40 nm to 70 nm, although other thicknesses are within the contemplated scope of the invention. In some embodiments of the invention, portions of the fins 102 are recessed, and the source and drain regions 608 are epitaxially grown on the recessed surface of the fins 102. The source and drain regions 608 can be epitaxially grown using, for example, vapor-phase epitaxy (VPE), molecular beam epitaxy (MBE), liquid-phase epitaxy (LPE), or other suitable processes. The source and drain regions 608 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 608 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the source and drain regions 608 are made of silicon or silicon germanium. In some embodiments of the invention, the source and drain regions 608 are made of silicon germanium having a germanium concentration of about 10 to about 65 percent, for example, 50 percent, although other germanium concentrations are within the contemplated scope of the invention.

Figure 7:
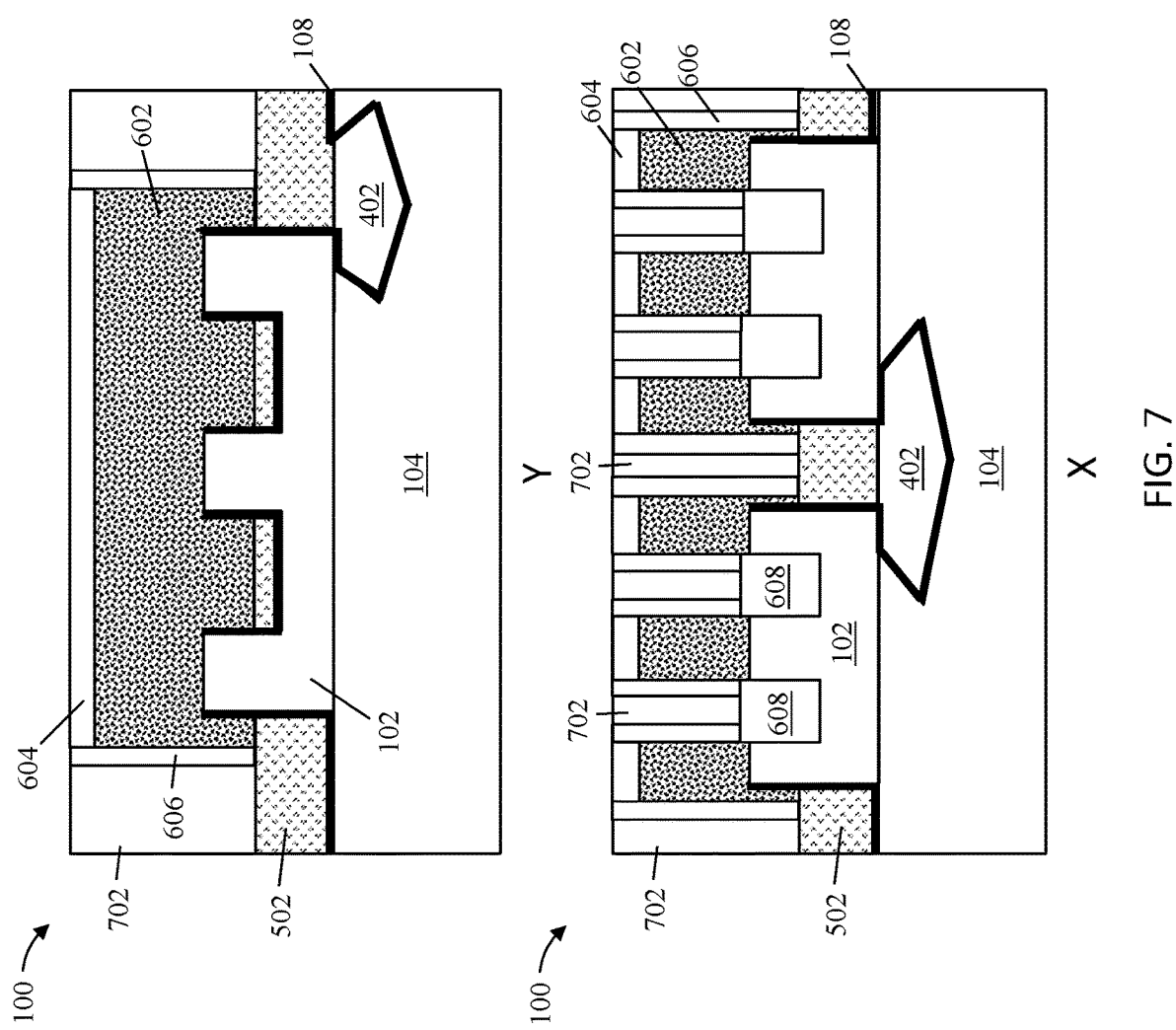
FIG. 7 depicts cross-sectional views of a semiconductor structure along the lines X and Y of FIG. 1 after one or more processing operations according to one or more embodiments of the invention.
Figure 8:
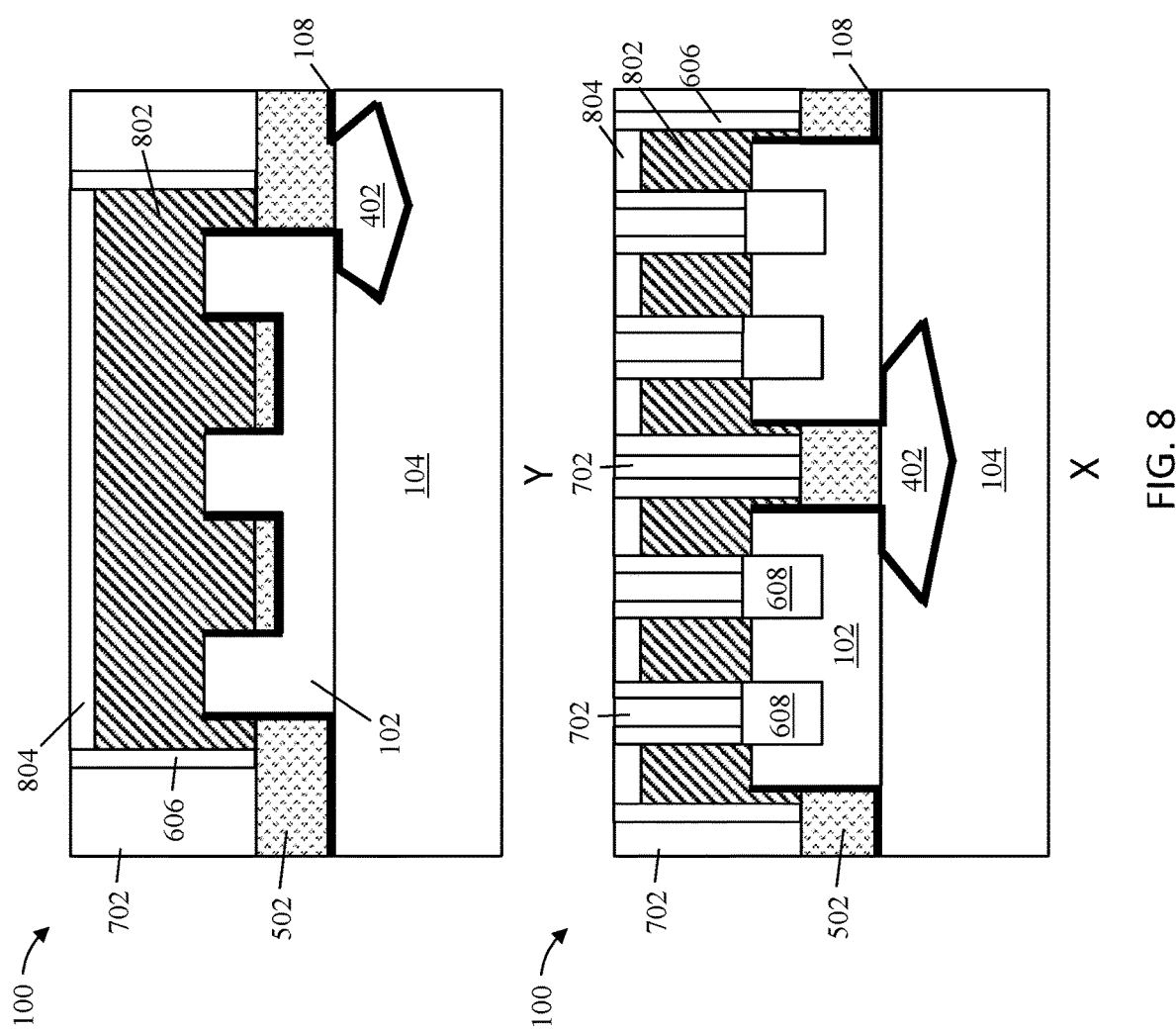
FIG. 8 depicts cross-sectional views of a semiconductor structure along the lines X and Y of FIG. 1 after one or more processing operations according to one or more embodiments of the invention.

FIG. 7 depicts cross-sectional views of the semiconductor structure 100 taken along the lines X and Y of FIG. 1 after a processing operation according to one or more embodiments of the invention. In some embodiments of the invention, a dielectric layer 702 can be formed over the semiconductor structure 100. In some embodiments of the invention, the dielectric layer 702 serves as an isolation structure for gates 802 of the semiconductor structure 100 (FIG. 8). The dielectric layer 702 can be made of any suitable dielectric material, such as, for example, low-k dielectrics, ultra-low-k dielectrics, porous silicates, carbon doped oxides, silicon dioxides, silicon nitrides, silicon oxynitrides, silicon carbide (SiC), or other dielectric materials. Any known manner of forming the dielectric layer 606 can be utilized, such as, for example, CVD, PECVD, ALD, flowable CVD, spin-on dielectrics, or PVD.

FIG. 8 depicts cross-sectional views of the semiconductor structure 100 taken along the lines X and Y of FIG. 1 after a processing operation according to one or more embodiments of the invention. In some embodiments of the invention, the sacrificial gates 602 and the hard mask 604 can be removed and replaced with gates 802 (sometimes referred to as active gates, conductive gates, or replacement metal gates).

The gates 802 can be high-k metal gates (HKMGs) formed over channel regions of the fins 102 using, for example, known replacement metal gate (RMG) processes, or so-called gate-first processes. As used herein, the "channel region" refers to the portion of the fins 102 over which the gates 802 are formed, and through which a current passes between the source and drain regions 608 in the final device. In some embodiments of the invention, the gates 802 are formed by removing the sacrificial gates 602 and any exposed portions of the liner 108, exposing a surface of the fins 102. High-k/metal gate materials can then be deposited into the cavity left after removing the sacrificial gates 602.

In some embodiments of the invention, the gates 802 can include a gate dielectric(s) (not shown) and a work function metal stack (not shown). In some embodiments, the gates 802 includes a main body formed from bulk conductive gate material(s).

In some embodiments of the invention, the gate dielectric is a high-k dielectric film formed on a surface (sidewall) of the fins 102. The gate dielectric can be made of, for example, silicon oxide, silicon nitride, silicon oxynitride, boron nitride, high-k materials, or any combination of these materials. As used herein, high-k materials are those having a large dielectric constant relative to silicon dioxide, i.e., more than about 3.9. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 802 include one or more work function layers (sometimes referred to as a work function metal stack) formed between the high-k dielectric film and a bulk gate material. In some embodiments of the invention, the gates 802 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 802 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 802 include a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As further depicted in FIG. 8, the gates 802 can include gate hard masks 804. The gate hard masks 804 can be made of any suitable material, such as, for example, silicon nitride. As the gate hard masks 804 are aligned to the gates 802 in the space between the spacers 218, the gate hard masks 804 can be thought of as self-aligned hard masks (sometimes referred to as SAC caps).

Figure 9:
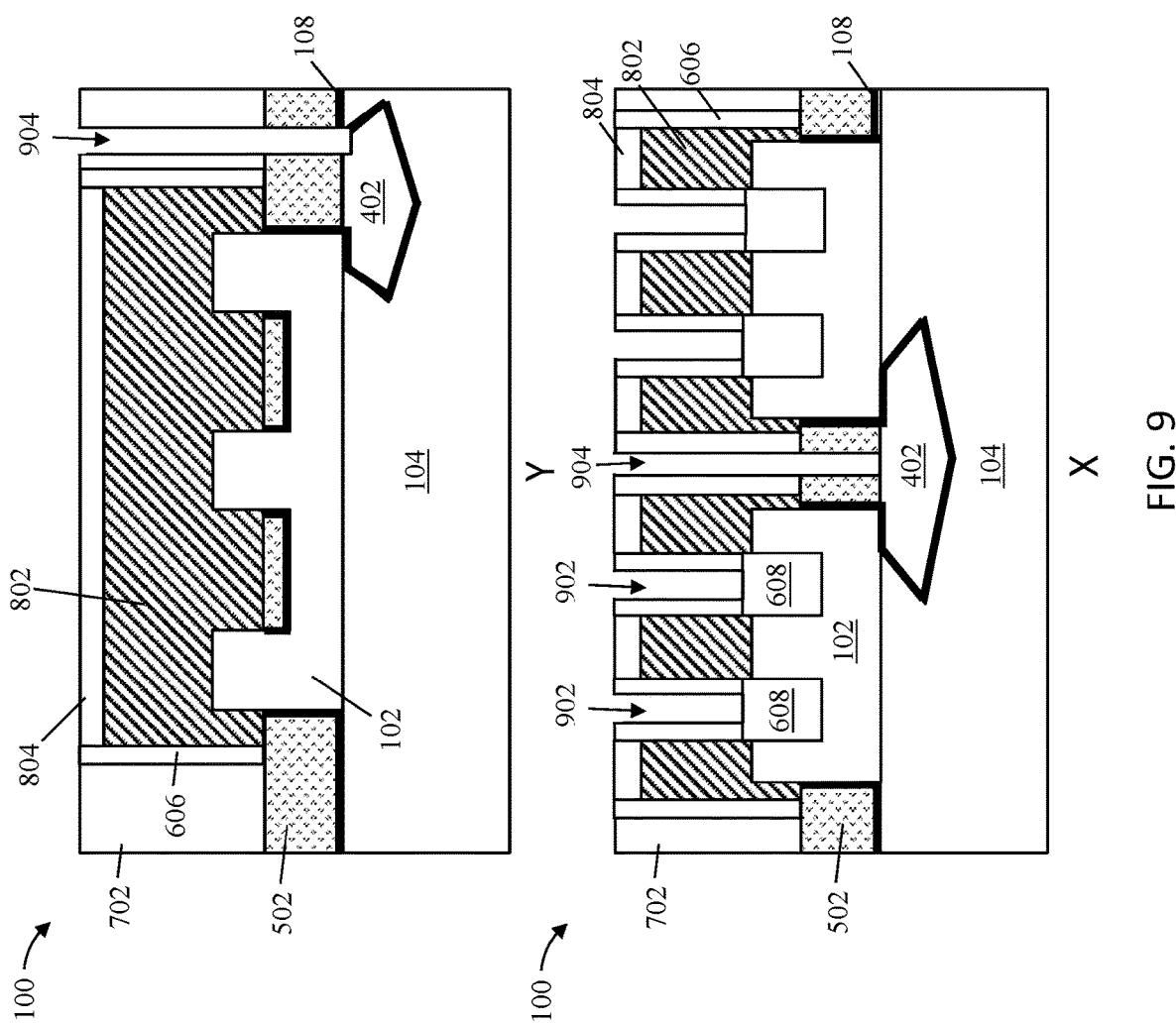
FIG. 9 depicts cross-sectional views of a semiconductor structure along the lines X and Y of FIG. 1 after one or more processing operations according to one or more embodiments of the invention.

FIG. 9 depicts cross-sectional views of the semiconductor structure 100 taken along the lines X and Y of FIG. 1 after a processing operation according to one or more embodiments of the invention. In some embodiments of the invention, portions of the dielectric layer 702 are removed (patterned) to form source/drain trenches 902 and buried contact trenches 904. In some embodiments of the invention, the source/drain trenches 902 expose a surface of the source and drain regions 608. In some embodiments of the invention, the buried contact trenches 904 expose a surface of the sacrificial region 402. The dielectric layer 702 can be patterned using a wet etch, a dry etch, or a combination of sequential wet and/or dry etches. In some embodiments of the invention, the dielectric layer 702 is removed selective to the spacers 606.

Figure 10:
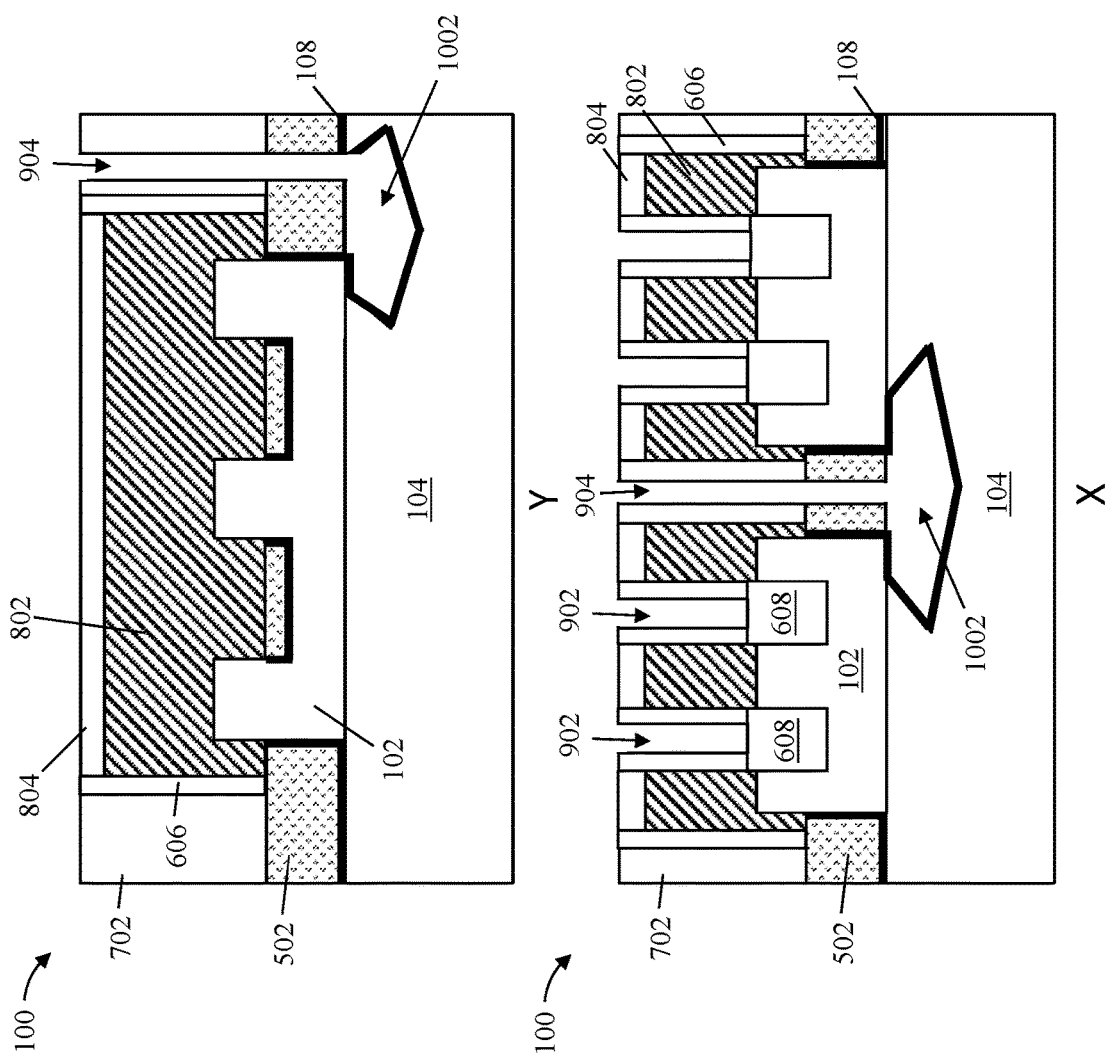
FIG. 10 depicts cross-sectional views of a semiconductor structure along the lines X and Y of FIG. 1 after one or more processing operations according to one or more embodiments of the invention.

FIG. 10 depicts cross-sectional views of the semiconductor structure 100 taken along the lines X and Y of FIG. 1 after a processing operation according to one or more embodiments of the invention. In some embodiments of the invention, the sacrificial region 402 is removed to form a cavity 1002 that exposes a surface of the liner 108. The sacrificial region 402 can be removed using a wet etch, a dry etch, or a combination of sequential wet and/or dry etches. In some embodiments of the invention, the sacrificial region 402 is removed selective to the spacers 606, the shallow trench isolation 502, and/or the liner 108.

Figure 11:
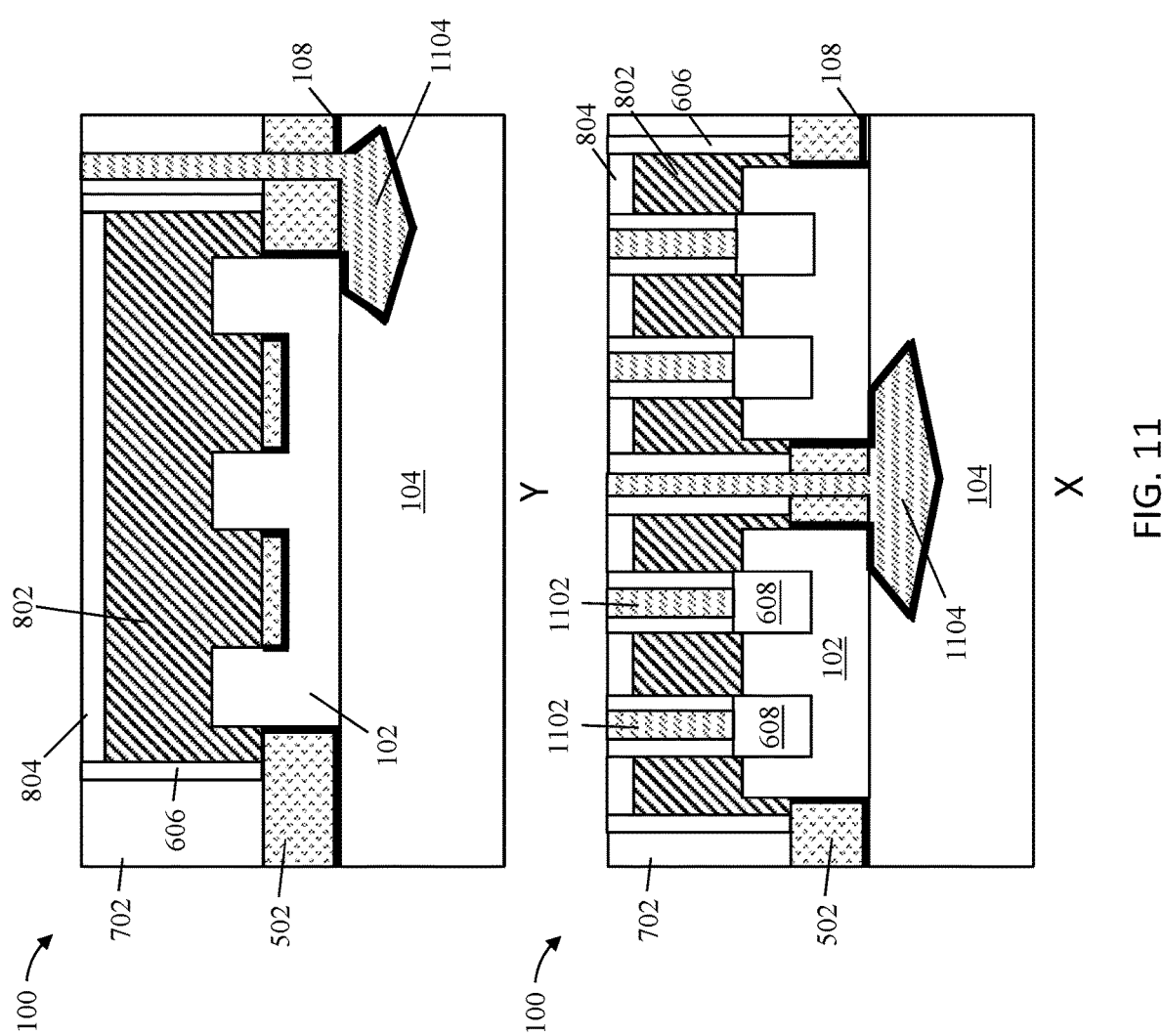
FIG. 11 depicts cross-sectional views of a semiconductor structure along the lines X and Y of FIG. 1 after one or more processing operations according to one or more embodiments of the invention.

FIG. 11 depicts cross-sectional views of the semiconductor structure 100 taken along the lines X and Y of FIG. 1 after a processing operation according to one or more embodiments of the invention. In some embodiments of the invention, source/drain contacts 1102 are formed in or deposited into the source/drain trenches 902. In some embodiments of the invention, a buried interconnect 1104 is formed in or deposited into the buried contact trenches 904 and the cavity 1002.

The source/drain contacts 1102 and the buried interconnect 1104 can be formed from materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the source/drain contacts 1102 and the buried interconnect 1104 are formed a same conductive material. For example, the source/drain contacts 1102 and the buried interconnect 1104 can be made of cobalt, copper, ruthenium, or tungsten. In some embodiments of the invention, the source/drain contacts 1102 and the buried interconnect 1104 are made of different conductive materials. For example, the source/drain contacts 1102 can be made cobalt or ruthenium and the buried interconnect 1104 can be made of copper, or vice versa. In some embodiments of the invention, the source/drain contacts 1102 and the buried interconnect 1104 include a barrier liner (sometimes referred to as a metal liner, or barrier metal liner) to prevent diffusion into surrounding dielectrics (not shown).

After forming the contacts 1102 and the buried interconnect 1104, the process flow can continue using known BEOL fabrication techniques. For example, one or more metallization or interconnect layers can be formed over the semiconductor structure 100.

Figure 12:
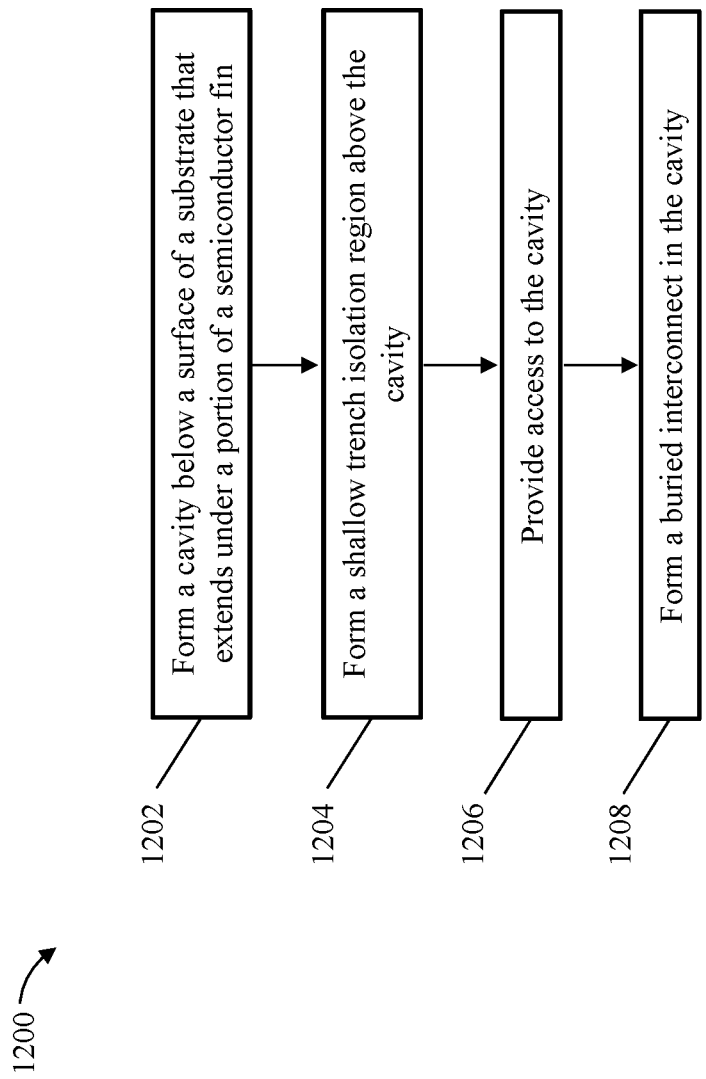
FIG. 12 depicts a flow diagram illustrating a method according to one or more embodiments of the invention.

FIG. 12 depicts a flow diagram 1200 illustrating a method for forming a buried interconnect structure of an integrated circuit according to one or more embodiments of the invention. As shown at block 1202, a cavity is formed below a surface of a substrate. In some embodiments of the invention, the cavity extends under a portion of a semiconductor fin on the substrate. In some embodiments of the invention, the cavity is formed by removing exposed portions of the substrate using an isotropic etch. In some embodiments of the invention, the cavity includes an unconfined region that extends under a logic portion of a substrate. In some embodiments of the invention, the unconfined region is a bulb-shaped region that undercuts the semiconductor fin by 50 to 250 nm as measured from a sidewall of the semiconductor fin.

At block 1204, a shallow trench isolation region is formed on the substrate above the cavity. In some embodiments of the invention, the cavity is filled with a sacrificial material. In some embodiments of the invention, a liner is formed in the cavity between the sacrificial material and the substrate. In some embodiments of the invention, the shallow trench isolation region is formed on the sacrificial material.

At block 1206, access is provided to the cavity. In some embodiments of the invention, a portion of the shallow trench isolation region is removed to expose a surface of the sacrificial material in the cavity. In some embodiments of the invention, the sacrificial material is removed from the cavity.

At block 1208, a buried interconnect is formed in the cavity. In some embodiments of the invention, the buried interconnect fills a bulb-shaped region. In some embodiments of the invention, the buried interconnect is positioned directly below the shallow trench isolation region. In some embodiments of the invention, a portion of the buried interconnect extends beyond a sidewall of the shallow trench isolation region. In some embodiments of the invention, a contact is formed that extends through a portion of the shallow trench isolation region to a surface of the buried interconnect.

The method can include forming a sacrificial gate over a channel region of the semiconductor fin. In some embodiments of the invention, the cavity extends under a portion of the sacrificial gate. In some embodiments of the invention, an interlayer dielectric is formed over the shallow trench isolation region and adjacent to the sacrificial gate. In some embodiments of the invention, the sacrificial gate is replaced with a conductive gate using known RMG processes. In some embodiments of the invention, source and drain (S/D) regions are formed adjacent to the channel region.

Figure 13:
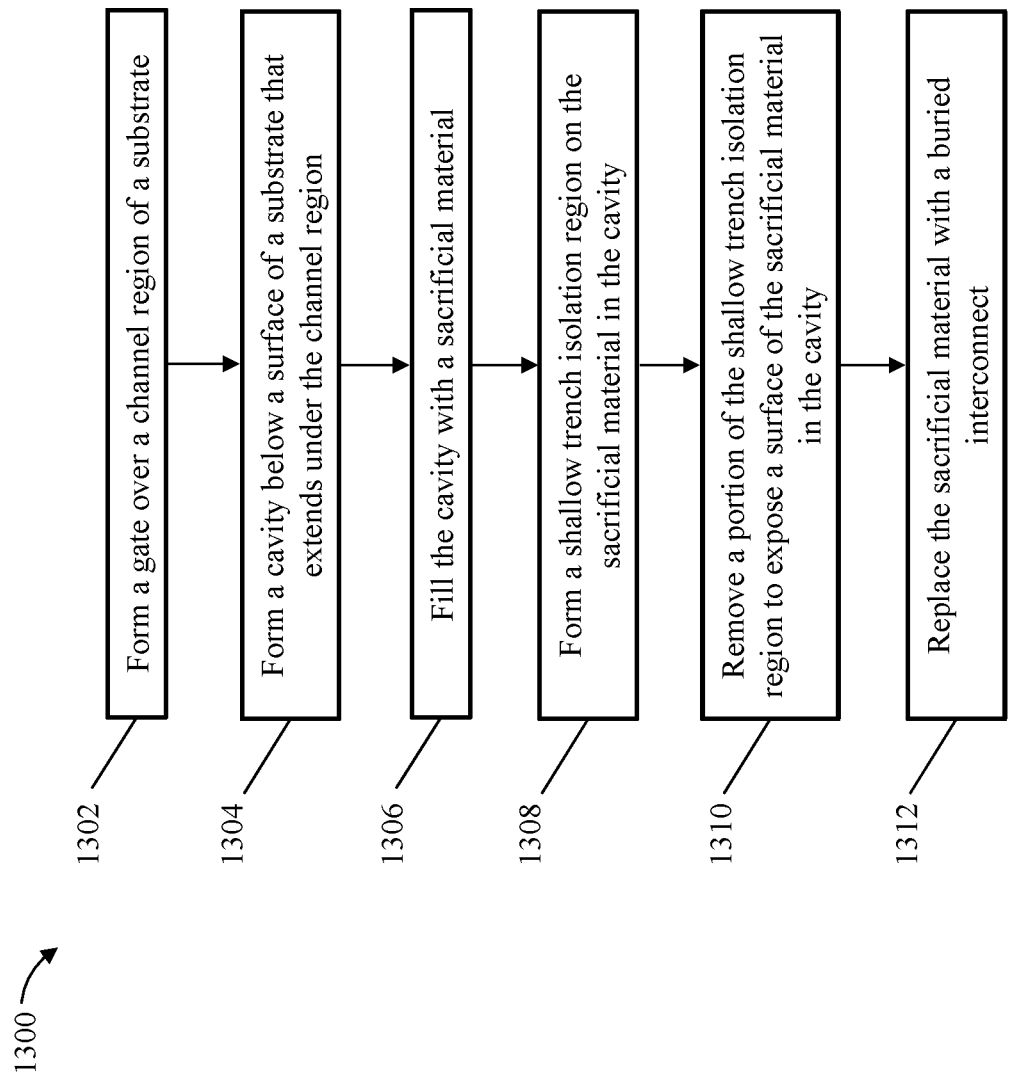
FIG. 13 depicts a flow diagram illustrating a method according to one or more embodiments of the invention.

FIG. 13 depicts a flow diagram 1300 illustrating a method for forming a semiconductor device according to one or more embodiments of the invention. As shown at block 1302, a gate is formed over a channel region of a substrate. In some embodiments of the invention, the gate is a sacrificial gate. In some embodiments of the invention, the sacrificial gate is replaced with a conductive gate after forming the sacrificial material in block 1306.

At block 1304, a cavity is formed below a surface of the substrate. In some embodiments of the invention, the cavity extends under the channel region. At block 1306, the cavity is filled with a sacrificial material.

At block 1308, a shallow trench isolation region is formed on the sacrificial material in the cavity. In some embodiments of the invention, an interlayer dielectric is formed over the shallow trench isolation region and adjacent to the sacrificial gate.

At block 1310, a portion of the shallow trench isolation region is removed to expose a surface of the sacrificial material in the cavity. At block 1312, the sacrificial material is replaced with a buried interconnect.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "removing a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a buried interconnect structure, the method comprising:
    forming a cavity below a surface of a substrate, the cavity extending under a portion of a semiconductor fin;
    forming a shallow trench isolation region above the cavity;
    removing a portion of the shallow trench isolation region to expose a top surface of a sacrificial material in the cavity; and
    forming a buried interconnect in the cavity.

2. The method of claim 1, wherein forming the cavity comprises an isotropic etch.

3. The method of claim 2, wherein the cavity comprises a bulb-shaped region.

4. The method of claim 3, wherein the bulb-shaped region undercuts the semiconductor fin by 50 to 250 nm from a sidewall of the semiconductor fin.

5. The method of claim 1 further comprising forming a liner in the cavity between a sacrificial material and the substrate.

6. The method of claim 1 further comprising forming a sacrificial gate over a channel region of the semiconductor fin, the cavity extending under a portion of the sacrificial gate.

7. The method of claim 6 further comprising forming an interlayer dielectric over the shallow trench isolation region and adjacent to the sacrificial gate.

8. The method of claim 7 further comprising replacing the sacrificial gate with a conductive gate.

9. The method of claim 1, wherein at least a portion of the buried interconnect is positioned directly below the shallow trench isolation region, and wherein a portion of the buried interconnect extends beyond a sidewall of the shallow trench isolation region.

10. A method for forming a semiconductor structure, the method comprising:
    forming a gate over a channel region of a substrate;
    forming a cavity below a surface of the substrate, the cavity extending under the channel region;
    filling the cavity with a sacrificial material;
    forming a shallow trench isolation region on the sacrificial material in the cavity;
    removing a portion of the shallow trench isolation region to expose a surface of the sacrificial material in the cavity; and
    replacing the sacrificial material with a buried interconnect.

11. The method of claim 10, wherein forming the cavity comprises an isotropic etch.

12. The method of claim 11, wherein the cavity comprises a bulb-shaped region.

13. The method of claim 10 further comprising forming a liner in the cavity between the sacrificial material and the substrate.

14. The method of claim 10, wherein the gate is a sacrificial gate.

15. The method of claim 14 further comprising replacing the sacrificial gate with a conductive gate.

16. The method of claim 10 further comprising forming an interlayer dielectric over the shallow trench isolation region and adjacent to the sacrificial gate.

* * * * *